US007039129B2

(12) United States Patent
Ratni et al.

(10) Patent No.: US 7,039,129 B2
(45) Date of Patent: May 2, 2006

(54) DEMODULATOR STRUCTURE UTILIZING DC SWITCHES

(75) Inventors: Mohamed Ratni, Esslingen (DE);
Dragan Krupezevic, Stuttgart (DE);
Veselin Brankovic, Esslingen (DE);
Masayoshi Abe, Tokyo (JP); Noboru Sasho, Kanagawa (JP)

(73) Assignees: Sony International (Europe) GmbH, Berlin (DE); Sony Corporation, Tokyo (JP)

( * ) Notice: Subject to any disclaimer, the term of this patent is extended or adjusted under 35 U.S.C. 154(b) by 788 days.

(21) Appl. No.: 09/901,273

(22) Filed: Jul. 9, 2001

(65) Prior Publication Data
US 2002/0009161 A1 Jan. 24, 2002

(30) Foreign Application Priority Data
Jul. 11, 2000 (EP) ................... 00114870

(51) Int. Cl.
*H44L 27/16* (2006.01)
(52) U.S. Cl. .............. 375/324; 375/340; 455/318; 455/323; 455/334
(58) Field of Classification Search ............. 375/229, 375/235, 316, 322, 324, 331, 340; 455/313–315, 455/318, 323, 325–328, 334–338; 329/304, 329/306
See application file for complete search history.

(56) References Cited

U.S. PATENT DOCUMENTS

| 4,521,728 A | * | 6/1985 | Li ................. 324/638 |
| 6,075,980 A | * | 6/2000 | Scheck .............. 455/324 |
| 6,115,593 A | * | 9/2000 | Alinikula et al. ...... 455/324 |
| 6,337,888 B1 | * | 1/2002 | Huang et al. .......... 375/322 |
| 6,650,178 B1 | * | 11/2003 | Brankovic et al. ...... 329/304 |

FOREIGN PATENT DOCUMENTS

| EP | 0 805 561 | 11/1997 |
| EP | 0 884 836 | 12/1998 |
| EP | 0 957 614 | 11/1999 |

OTHER PUBLICATIONS

J. Li et. al.: "A Six-Port Direct Digital Millimeter Wave Receiver" 1994 IEEE MTT-S International Microwave Symposium Digest, vol. 3, May 23, 1994, pp. 1659-1662, XP000512814.

* cited by examiner

*Primary Examiner*—Dac V. Ha
(74) *Attorney, Agent, or Firm*—Oblon, Spivak, McClelland, Maier & Neustadt, P.C.

(57) ABSTRACT

The present invention relates to an I/Q demodulator (21) comprising a n-port structure (1,16) is provided, wherein n is an integer value of 4,5 or 6. The demodulator (21) is supplied at a first input (3) with a RF signal (2) which has to be demodulated. At a second input (5) it is supplied with a second RF signal (4). The n−2 output signals (6) are detected by power sensors (7). After low pass filtering (14) the output signals of the power sensors (7) are multiplexed by a multiplexing means (8).

19 Claims, 4 Drawing Sheets

DEMODULATOR STRUCTURE UTILIZING DC SWITCHES

Figure 1:
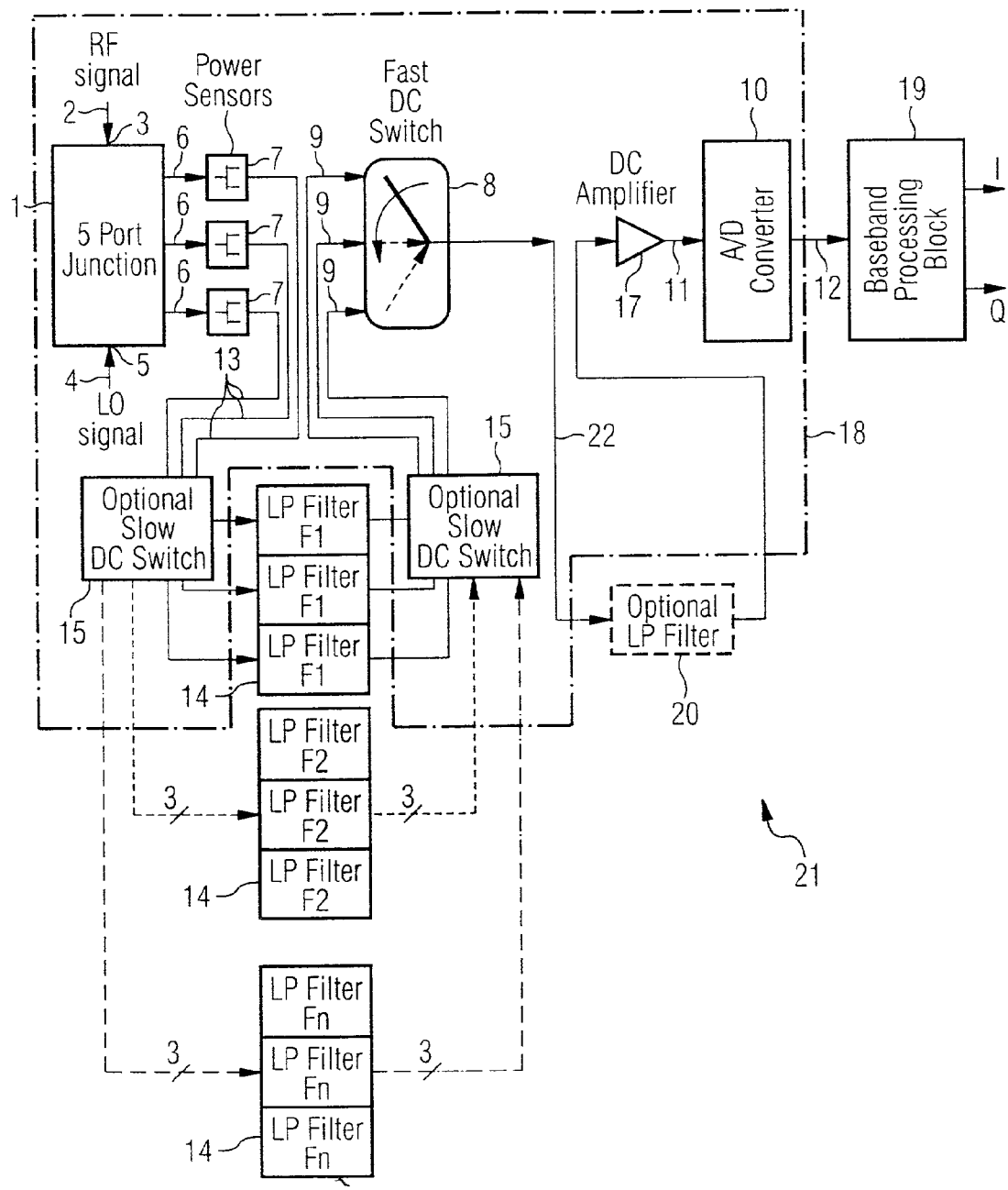

The present invention relates generally to an I/Q demodulator for demodulating modulated RF signals, a software radio device and a method for demodulating modulated RF signals.

A six-port receiver is known acting in the direct conversion manner and allowing conversion from mm-wave range and microwave range directly to the base band. At the same time a classic I/Q-demodulation chip (digital or analog) can be avoided. By using suitable calibration procedures the influences of the non-ideal passive RF-components including manufacturing tolerances can be minimized. The six-port receiver detects the relative phase and relative magnitude of two incoming RF-signals. The circuitry of the six-port receiver is realized using only passive components in combination with diodes for the detection of the relative phase and the relative magnitude of the RF-signals. An important feature of six-port receivers is that fabrication tolerances can be calibrated, which inherently allows low-cost production.

In Bossisio, Wu "A six-port direct digital millimeter wave receiver", Digest of 1994 IEEE MTT Symposium, vol. 3, page 1659–1662, San Diego, May 1994, a structure for a six-port receiver is proposed.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at at least three and particularly four of the 6 ports. The imperfections of the hardware can be readily eliminated by an appropriate calibration procedure. Very accurate measurements can be made in a large dynamic range and wide frequency range six-port junction receivers consist of passive microwave components such as directional couplers and power dividers as well as diode detectors. The circuit can be easily integrated as MHMIC or MMIC. The known receiver performs direct phase/amplitude demodulation at microwave and mm-wave frequencies.

By performing a calibration procedure the hardware imperfections such as phase error of the bridges, imbalance of the power detectors, etc. can be readily eliminated. This significantly eases the requirement of the hardware implementation and enables the six-port receiver to operate over a wide band up to mm-wave frequencies.

According to the above cited document of Bossisio et. al. a six-port receiver concept with power dividers and 90 degrees hybrid circuits realized in distributed technology is used. The application of that known structure lies mainly in the frequency bands above 10 GHz, however, it suffers from an insufficient band width of the operation due to the inherently frequency selective nature of the 90 degrees hybrid circuits.

From D. Maurin, Y. Xu, B. Huyart, K. Wu, M. Cuhaci, R. Bossisio "CPW Millimeter-Wave Six-Port Reflectometers using MHMIC and MMIC technologies", European Microwave Conference 1994, pp. 911–915, a wide-band topology for reflectometer used is known which is based on a distributing element approach featuring coplanar wave guide applications in the frequency range from 11 to 25 GHz.

From V. Bilik, et al. "A new extremely wideband lumped six-port reflectometer" European Microwave Conference 1991, pp. 1473–1477 and the idea of using Wheatstone Bridges and resistive structures for reflectometer applications is known.

From j: Li, G. Bossisio, K. Wu, "Dual tone Calibration of Six-Port Junction and its application to the six-port direct digital receiver", IEEE Transactions on Microwave Theory and Techniques, vol. 40, Jan. 1996 a six-port reflectometer topology based on four 3 dB hybrid circuits, power dividers and attenuators is known.

From U.S. Pat. No. 5,498,969 an asymmetrical topology for a reflectometer structure featuring matched detectors and one unmatched detector is known.

From U.S. Pat. No. 4,521,728 with the title "Method and six-port network for use in determining complex reflection coefficients of microwave networks" a reflectometer six-port topology is known comprising two different quadrate hybrids, phase shifter, two power dividers and one directional coupler for which the realization by a microstrip line technology is disclosed.

From EP-A-0 805 561 a method for implementing a direct conversion receiver with a six-port junction is known. According to this known technique, modulated transmitted modulation is received by a direct conversion receiver which comprises a six-port junction. The demodulation is carried out analogically.

From EP-A-0 841 756 a correlator circuit for a six-port receiver is known. In this correlator circuit the received signal is summed up with a local oscillator signal at various phase angles, wherein the phase rotation between the local oscillator and RF signals is carried out separately from the summing of the correlator outputs.

Figure 3:
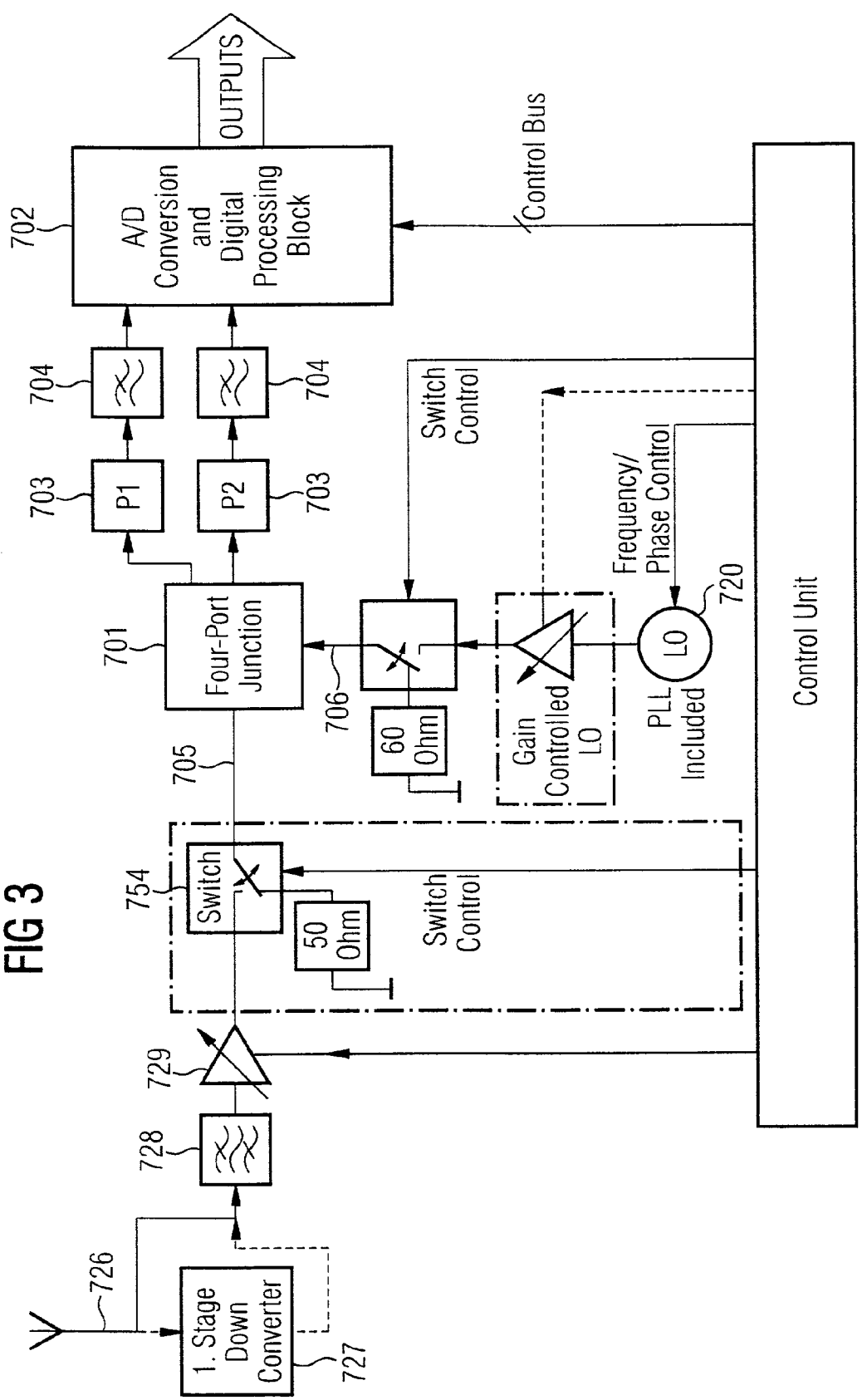

From WO98/08329 a n-port junction device for processing modulated digital RF signals is known. N is an integer value larger than 3. For the case of a I/Q demodulator with a four port junction FIG. 3 shows a block scheme.

A modulated RF signal is received by means of an antenna 726. As an example, the received RF signal can be (m)PSK- or (n)QAM, preferably QPSK modulated. The received signal can be passed through a first down converting stage 727. However, it is to be noted that said first down converting stage 727 is only optional. Then the signal is passed through a band pass filter (BPF) 728 and supplied to a gain controlled LNA (low noise amplifier) 729. The output signal of the LNA is fed to a switch 754 and then to a first input of a four-port junction device 701. The second input of the four-port junction device 701 is supplied with RF signal from a gain controlled local oscillator 720.

The four-port junction device 701 combines the two input signals 705, 706 in linear combinations and outputs two signals, wherein the analog power values of the output signals of the four-port junction device 701 are detected by power detectors P1 and P2 703. Then the output signals of the power detectors P1, P2 703 are low pass filtered 704. Thereafter each of the signals has to be A/D converted 702 and supplied to a digital processing block 702 comprising also digital filter means.

In view of the above prior art, it is the object of the present invention to provide for a improved structure of a I/Q demodulator comprising a n-port structure by means of reducing the A/D converters and digital filter requirements.

According to the present invention therefore a I/Q demodulator comprising a n-port structure is provided, wherein n is an integer value of 4, 5 or 6. The demodulator is supplied at a first input with a RF signal which has to be demodulated. At a second input it is supplied with a second RF signal. The n−2 output signals are detected by power sensors. After low pass filtering the output signals of the power sensors are multiplexed by a multiplexing means. The IQ demodulator comprises a single A/D converter which is supplied with an analog signal. This one originates from the multiplexing means. The outputting signal is a digital signal which leads to a digital processing unit.

The output signal of the power sensors can be selectively passed through different low pass filters which have different cut-off-frequencies.

Additionally there are DC-switches for the selection of the low pass filters.

The n-port can be a five port junction but in the case of a four port junction the demodulator is QAM or PSK demodulator.

The multiplexing means is DC-switch with a switching time off $$\frac{1}{n-2}$$

times the symbol duration. Before or after the multiplexing means at least one DC amplifier is provided. After the multiplexing means there is low pass filter which has a cut-off-frequency of $$\frac{n-2}{2}B.$$

The output signal of the power sensor is low pass filtered with a cut-off-frequency of $$\frac{B}{2}.$$

B is the maximum bandwidth of the RF signal to be demodulated.

The n-port, the power sensors and said multiplexing means are integrated on one single chip.

According to the present invention furthermore a software radio device comprising a said I/Q demodulator is provided.

The invention furthermore relates to a method for I/Q demodulation. Therefore, a RF signal which has to be demodulated is input in a n-port structure, although a second RF signal is input in a n-port structure. Then the power of n−2 output signals of the n-port structure (n being 4, 5 or 6) is detected. After that the detected power signals are low-pass-filtered. At least the low-pass-filtered power signals are multiplexed.

The method can furthermore comprise the step of supplying a single A/D converter with the multiplexed power signals and outputting a digitally converted signal to a digital processing unit. Power signals can be selectively filtered with different cut-off-frequencies.

Additionally the step of multiplexing is implemented by DC-switch with a switching time $$\frac{1}{n-2}$$

of the symbol duration.

The multiplexed power signals are low-pass-filtered with a cut-off-frequency of $$\frac{n-2}{2}B.$$

Thereby the non multiplexed power signals are low-pass-filtered with the cut-off-frequency of $$\frac{B}{2}.$$

B is the maximum bandwidth of the RF signal to be demodulated.

In the following description further features, characteristics and advantages of the present invention will come clearer by means of a detailed explanation of embodiments of the present invention and by reference to the figures of the enclosed drawings.

Figure 2:
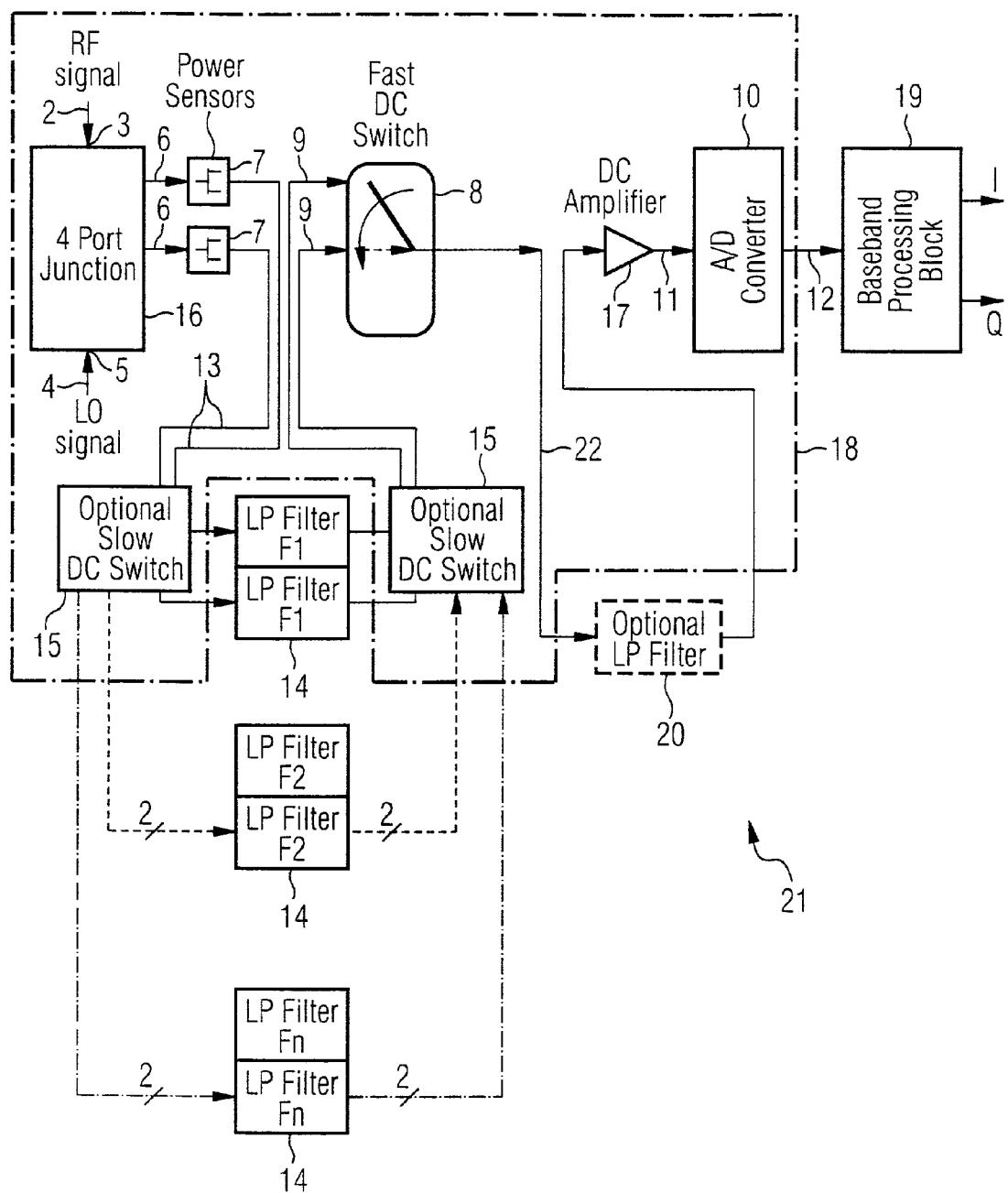
Figure 4:
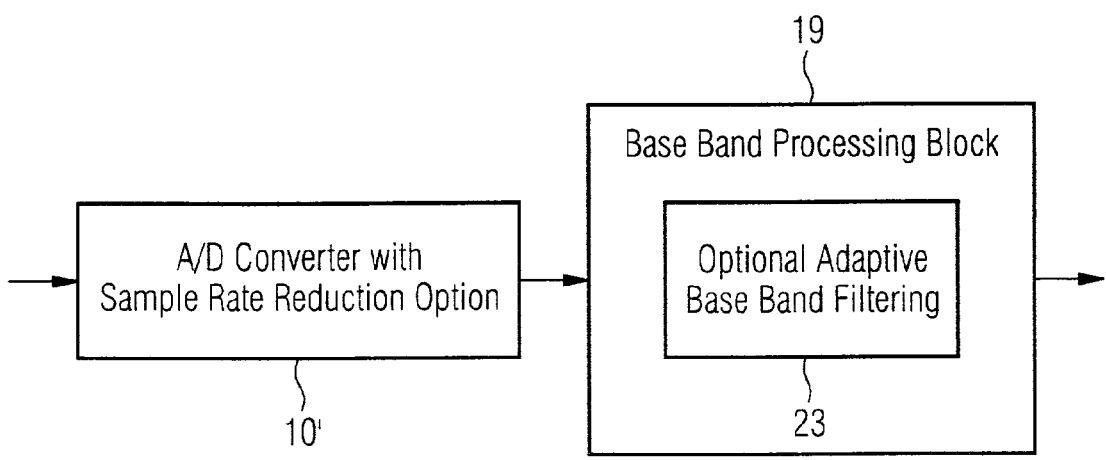

FIG. 1 shows generally a I/Q demodulator comprising a n-port structure for the case of n=5, FIG. 2 shows generally a I/Q demodulator comprising an n-port structure for the case of n=4, FIG. 3 shows a block scheme for the explanation of a I/Q demodulator comprising an n-port structure, state of the art, and FIG. 4 shows an A/D converter with an adaptive sampling rate and a base band processing block having optional base band filtering means.

FIG. 1 shows a generally scheme of an I/Q demodulator 21 comprising a five-port junction device 1. The proposed topology of FIG. 1 can be divided into several parts. The first part which comprises RF circuitry includes a five-port junction 1 and three power sensors 7, preferably realized by detectors using FET transistors. The five-port is only an example for a n-port junction device, n being an integer of 4,5 or 6.

At a first input 3 the five-port 1 is supplied with a modulated RF signal 2 to be demodulated and at a second input 5 it is supplied with a second RF signal 4 from a local oscillator LO which frequency corresponds essentially to the carrier frequency of the first RF signal 2. The five-port means 1 comprises three output ports which are connected to three power sensors 7 which detect the power of the RF signals 6 and output the power detection signals 13. Regarding the intended structure and operation of the five-port junction device 1 and the power sensors 7 reference is explicitly made to WO98/08329.

Furthermore optionally two "slow" DC-switches 15 are provided which are rerouting the DC signals to one or more low-pass filter banks 14. "Slow" in this connection is to be understood lower than in comparison with the symbol duration. Each of the filter bank 14 comprises a number of parallel arranged filter whereby each of them may consist of a number of serial connected filter. The optional usage of more than one low pass filter bank 14 may be useful for some types of multi-system receivers or future software radio solutions as will be explained later on.

Software-defined radio (SDR) solutions can be reconfigured (with software downloaded either over-the-air or locally) to operate over a wide frequency band and with a variety of digital modulation formats, such as M-ary phase-shift keying (M-PSK) or M-ary quadrature-amplitudemodulation (M-QAM). For example one filter bank 14 is specified for a video transmission the other for speech transmission requiring a lower bandwidth. In both cases the requisite cut-off frequency of the actual filter bank is different.

The DC output signal 13 of the power sensor 7 is low-pass-filtered in the filter banks 14 with a cut-off-frequency of $$\frac{B}{2},$$

wherein B is the maximum bandwidth of the RF signal to be demodulated.

The optional "slow" DC-switches 15 are slow as, when changing operation from one radio system to another, using the same device is usually done by user preferences, so the routing time may be considered as being much more larger compared to the symbol duration. Note that in principle future multi-system solution may need to cope with narrow band signals like GSM having bandwidth of 200 kHz, UMTS with 5 MHz and Hiperlan II having a bandwidth of 20 MHz. In this case an additional filter bank having smaller cut-off-frequency may be advantageous.

After passing through the low-pass filter bank 14, the signals are then supplied to a further optional low speed DC-switch 15 (which is routing the signals from the optional filter bank 14) and to a fast DC-switch 8 having the function of a multiplexing means. The fast DC-switch 8 multiplexes the (n−2) outputs from the low-pass on one single transmission line 22 The fast DC-switch 8 of the new proposed architecture has a switching time three times shorter (generally (n−2) times) than the symbol duration. When demodulating signals with a shorter symbol duration the switching time is changed accordingly.

The fast DC-switch 8 is followed by a optional low-pass filter 20 having a theoretical cut-off frequency of $$\frac{(n-2)B}{2}.$$

In the case of n=5 (five-port junction device), the cut-off frequency is $$\frac{3B}{2}.$$

Note that B is the bandwidth of the RF signal which has to be demodulated.

The low-pass filter 20 is followed by a single A/D converter 10 having a sampling rate large enough to accommodate a bandwidth of $$\frac{3B}{2}.$$

The possibility of low-pass-filtering the multiplexed single transmission line 22 may be advantageous in order to minimize the A/D converter 10 requirements (less number of the bits by high sampling speed) and requirements on baseband digital filtering. This reduces actually a typical problem by software radio solution, where adjacent channel interference of narrow band signals has to be minimized.

Between the low-pass filter 20 and the single A/D converter 10 there is provided a DC amplifier 17. It should be also denoted that optional the DC amplifier 10 may be placed before or after the filter bank 20, but before the fast DC-switch 8.

The A/D converter 10 is supplied with the analog signal which is originating from the fast DC-switch 8. The A/D converter 10 is outputting a digitally converted signal to a digital processing unit 19. Regarding the digital processing unit 19 reference is explicitly made to WO98/08329.

All of the devices in the dashed bounded area of FIG. 1 can be integrated on one single chip.

FIG. 2 shows also a block diagram of an I/Q demodulator comprising in this case a four-port junction device 16. The method of operation is related mainly for an operation as PSK demodulator or QAM demodulator. The description of FIG. 2 is nearly the same as that of FIG. 1. The difference is that in FIG. 2 the number of power sensors 7 is reduced to two and the fast DC-switch 8 has a switching time equal to one half of the symbol duration. This is due to the fact that in FIG. 2 n=4 (four-port junction device 16) and the low-pass filter 20 has a theoretical cut-off frequency of B (in the case of n=4).

Additionally the A/D converter 10 has a sampling rate able to accommodate the actual system bandwidth of B, rather than $$\frac{3B}{2}$$

as in case of the five-port junction 1 able to work as classic I/Q demodulator.

The proposed solution is advantageous compared to known five-port direct receivers and four-port demodulators because the number of the A/D converters may be reduced to one compared to the state of the art which is shown in FIG. 3.

Of course, reducing A/D converters and digital filter requirements is done by the cost of adding a slow DC-switch 15 and an additional filter bank 14. However, availability of the high speed A/D converters 10 and improvement of the technology versus time may justify this approach.

Moreover the introduction of low pass filter bank 14 having different cut-off-frequencies, reduces requirements or number of bits for A/D converters 10 and baseband processing time. Those two steps may provide a good step toward multi-system integration solution and future software radio platform.

FIG. 4 shows further developments of the A/D converter 10 and the base band processing block 19. According to these (optional) further developments the A/D converter 10' may have an adaptive sampling rate. For example in case of signals having a reduced physical bandwidth, the sampling rate of the A/D converter 10' can be reduced correspondingly thus reducing the power consumption of the converter.

The base band block optionally can be provided with an additional (f.e. analogue) filtering unit 23

The invention claimed is:

1. An I/Q demodulator comprising:
an n-port structure being supplied with a first RF signal to be demodulated at a first input and with a second RF signal to be demodulated at a second input, said n-port structure outputting n−2 output signals of a plurality of power sensors, with n being 4, 5 or 6, and a multiplexing means for multiplexing low-pass-filtered output signals of the plurality of power sensors to a single output.

2. The I/Q demodulator according to claim 1, wherein said I/Q demodulator further comprises a single A/D converter that is supplied with an analog signal originating from the multiplexing means and outputting a digitally converted signal to a digital processing unit.

3. The I/Q demodulator according to claim 2, wherein the A/D) converter has an adaptive sampling rate.

4. The I/Q demodulator according to claim 2, wherein the digital processing unit comprises an adaptive baseband filtering unit.

5. The I/Q demodulator according to claim 1, wherein the output signals of the plurality of power sensors are selectively passed through different low-pass-filters having different cut-off-frequencies.

6. The I/Q demodulator according to claim 5, wherein said I/Q demodulator further comprises switches for selecting the different low-pass-filters.

7. The I/Q demodulator according to claim 1, wherein the n-port structure is a five-port-junction.

8. The I/Q demodulator according to claim 1, wherein the n-port structure is a four-port-junction and the demodulator is a (M)QAM or a (M)PSK demodulator.

9. The /Q demodulator according to claim 1, wherein the multiplexing means is a DC-switch with a switching time of 1/n−2 times a symbol duration.

10. The 1/Q demodulator according to claim 1, wherein before or after the multiplexing means at least one DC-amplifier is provided.

11. The I/Q demodulator according to claim 1, further comprising a low-pass-filter following the multiplexing means and, said low-pass filter having a cut-off-frequency of n−2/2 B, whereby the output signals of the plurality of power sensors are low-pass-filtered with a cut-off-frequency of B/2, where B is a maximum bandwidth of the RF signal to be demodulated.

12. The I/Q demodulator according to claim 1, wherein the n-port structure, the plurality of power sensors and said multiplexing means are integrated on a single chip.

13. A software radio device wherein said radio device comprises an I/Q-demodulator according to claim 1.

14. A method for I/Q-demodulation, said method comprising the steps of;

inputting a first RF signal to be demodulated in an n-port structure, inputting a second RF signal in an n-port structure, detecting the power of n−2 output signals of a plurality of output sensors of the n-port structure, n being 4,5 or 6, low-pass-filtering the detected power signals, and multiplexing the low-pass-filtered power signals to a single file output.

15. The method according to claim 14, said method further comprising the step of:

supplying a single A/D converter with the multiplexed power signals and outputting a digitally converted signal to a digital processing unit.

16. The method according to claim 15, said method further comprising the step of:

adapting a sampling rate of the A/D converter depending on a bandwidth of the RF signal to be demodulated.

17. The method according to claim 14, wherein the power signals are selectively filtered with different cut-off-frequencies.

18. The method according to claim 14, wherein the step of multiplexing is implemented by a DC-switch with a switching time $1/n_2$ of a symbol duration.

19. The method according to claim 14, wherein the multiplexed power signals are low-pass-filtered with a cut-off-frequency of n−2/2 B, whereby non-multiplexed power signals are low-pass-filtered with the a cut-off-frequency of B/2}, where B is a maximum bandwidth of the RF signal to be demodulated.

* * * * *